United States Patent [19]

Hatakeyama

[11] Patent Number: 5,708,267
[45] Date of Patent: Jan. 13, 1998

[54] PROCESSING METHOD USING FAST ATOM BEAM

[75] Inventor: Masahiro Hatakeyama, Kanagawa-ken, Japan

[73] Assignee: Ebara Corporation, Tokyo, Japan

[21] Appl. No.: 677,166

[22] Filed: Jul. 9, 1996

Related U.S. Application Data

[63] Continuation of Ser. No. 267,222, Jul. 5, 1994, abandoned.

[30] Foreign Application Priority Data

Jul. 5, 1993 [JP] Japan .................. 5-192072
Jun. 14, 1994 [JP] Japan .................. 6-156811

[51] Int. Cl.⁶ .................................................. H05H 3/00
[52] U.S. Cl. ........................................ 250/251; 250/492.1
[58] Field of Search ........................ 250/251, 492.1, 250/492.21

[56] References Cited

U.S. PATENT DOCUMENTS

| | | | |
|---|---|---|---|
| 3,860,783 | 1/1975 | Schmidt | 250/492.21 |
| 4,678,536 | 7/1987 | Murayama et al. | 156/635 |
| 4,774,416 | 9/1988 | Askary et al. | 250/251 |
| 4,789,779 | 12/1988 | Drullinger | 250/251 |
| 5,108,543 | 4/1992 | Suzuki et al. | 156/643 |
| 5,108,778 | 4/1992 | Suzuki et al. | 156/643 |
| 5,110,407 | 5/1992 | Ono et al. | 156/643 |
| 5,216,241 | 6/1993 | Hatakeyama et al. | 250/251 |
| 5,243,189 | 9/1993 | Nagai et al. | 250/251 |
| 5,316,616 | 5/1994 | Nakamura et al. | 156/643 |
| 5,350,480 | 9/1994 | Gray | 156/345 |

FOREIGN PATENT DOCUMENTS

| | | |
|---|---|---|
| 0 136 752 | 4/1985 | European Pat. Off. . |
| 0 306 275 | 3/1989 | European Pat. Off. . |
| 0 360 655 | 3/1990 | European Pat. Off. . |
| 0 522 296 | 1/1993 | European Pat. Off. . |

OTHER PUBLICATIONS

J. Appl. Phys, Sep. 1989, Shimokawa et al., 66:2613–2618, *Active–fast–atom beam etching of GaAs using $Cl_2$ gas* Practice of Integrated Circuit Techniques, Nakamura et al., pp. 22–23.

*Primary Examiner*—Bruce Anderson
*Attorney, Agent, or Firm*—Armstrong, Westerman, Hattori, McLeland & Naughton

[57] ABSTRACT

A processing method using a fast atom beam wherein a surface of a substrate to be processed is covered with a masking member formed with patterned holes and the masking member is irradiated with the fast atom beam from a fast atom beam generator so that substrate is processed by the fast atom beam applied to the surface of the substrate through the patterned holes of the masking member.

12 Claims, 9 Drawing Sheets

Fig. 1(a)

STEP 1

Fig. 1(b)

STEP 2

Fig. 1(c)

STEP 3

PROCESSING METHOD USING FAST ATOM BEAM

This application is a continuation of application Ser. No. 08/267,222 filed Jul. 5, 1994, now abandoned.

BACKGROUND OF THE INVENTION

1. Field of the Art

The present invention relates to a processing method using a fast atom beam wherein a surface of an object to be processed is covered with a masking member formed with a patterned hole enabling the surface of the object to be directly irradiated with a fast atom beam or a combination of a fast atom beam and light energy or the like through the patterned hole, thereby forming the patterned shape on the object.

2. Prior Art

Conventional processing techniques for forming a patterned shape on an object include cutting procedures utilizing a cutting tool, a chemical reaction, a converging beam or the like. In fine pattern processing carried out in the field of semiconductors in particular, dry etching and wet etching, which use a resist, are employed.

The processing method employed depends on the material to be processed and also on the processing dimension and accuracy required. As one example of a conventional processing method, a fine pattern processing technique employed in the manufacture of semiconductor devices, in which high processing accuracy and advanced surface treating technique are required, will be explained below.

FIGS. 9(a) to 9(e) show one example of the process sequence of the conventional fine pattern processing that uses a resist. First, a substrate 1 to be processed is coated with a resist material 2 (Step 1). Next, ultraviolet rays 4 are applied to the resist material 2 through a photomask 3, thereby transferring patterned holes 3a formed in the photomask 3 to the resist material 2 (Step 2). Next, portions of the resist material 2 which were irradiated with the ultraviolet rays 4 through the patterned holes 3a are removed by development (Step 3). Next, portions of the substrate 1 where no resist material 2 is present are subjected to anisotropic etching by using ionic or radical species in a plasma (Step 4). Finally, the resist material 2 is removed (Step 5). By the above-described process sequence, holes 1c having the same configuration as that of the patterned holes 3a in the photomask 3 are formed in the surface of the substrate 1. Thus, fine pattern processing is effected. In general, the above-described process sequence is repeated to fabricate a semiconductor device on the substrate.

However, the conventional method involves a complicated process, as described above, and suffers from the problem that it is extremely difficult to accurately form a structure in which the shapes in a depthwise direction of processed portions differ from each other.

SUMMARY OF THE INVENTION

In view of the above-described circumstances, it is an object of the present invention to eliminate the above-described problems and to provide a processing method using a fast atom beam, whereby various patterns can be efficiently formed.

To solve the above-described problems, the present invention provides a processing method which comprises the step of: covering a surface of an object to be processed with a masking member formed with a patterned hole therein in close contact with or with a predetermined gap spaced from the surface of the object, and irradiating the masking member with the fast atom beam of atoms or molecules having a relatively large kinetic energy so that the object is processed by the fast atom beam applied to the surface of the object through the patterned hole of the masking member.

According to an another aspect of the invention, the processing method is characterized in that the masking member is moved relative to the object for irradiating the selected portions of the object with the fast atom beam.

According to a further aspect of the invention, the processing method is characterized in that the object is moved relative to the masking member for irradiating the selected portions of the object with the fast atom beam.

According to a still further aspect of the invention, the processing method is characterized in that a surface of the same object to be processed is sequentially covered with masking members having different patterned holes, and the surface of the object is irradiated with the fast atom beam for each masking member, thereby processing the object.

According to a still another aspect of the invention, the processing method is characterized in that at least one selected from among light energy, laser beam, radiation, X-rays, radical particles, electron beam, and an ion beam is used in combination with the fast atom beam.

Atoms and molecules that create thermal motion in the atmosphere at ordinary room temperature generally have a kinetic energy of about 0.05 eV. Atoms and molecules that have a much larger kinetic energy than the above are generally called "fast atom", and when a group of such fast atoms flow in the form of a beam in one direction, it is called "fast atom beam". Since the fast atom beam is electrically neutral, a processing technique using such a fast atom beam can be applied not only to metals and semiconductors but also to insulators such as plastics, ceramics, etc., to which the processing technique that uses charged particles cannot effectively be applied.

In the present invention, a surface of an object to be processed is covered with a masking member formed with a patterned hole for passing the fast atom beam, and then the fast atom beam is applied to the surface of the object through the patterned hole. Consequently, the surface of the object is directly processed in the shape of the patterned hole. Accordingly, it is possible to form a pattern of the desired shape on the object without the conventional troublesome resist coating and resist pattern forming steps. A masking member having a precise patterned hole may be formed by cutting the hole in a thin stainless steel plate by laser beam or by casting Ni thin film by electric forming technique.

In addition, since the depth of a processed portion depends on the fast atom beam irradiation time, three-dimensional processing for different depths can also be performed by using a plurality of masking members having different patterns and applying the fast atom beam with the irradiation time being varied.

Also, since the fast atom beam has excellent directivity, a patterned hole or holes having a precise shape and size may easily be formed in the object even if the masking member is not in close contact with the surface of the object, which eliminates the need for conventional resist pattern forming.

Further, by using at least one selected from among light energy, laser beam, a radiation, X-rays, electron beam, radical particles and an ion beam in combination with the fast atom beam, the processing speed can be increased because ions and or radicals which have high chemical reactivity and low energy are adsorbed on the surface of the object by irradiation with light energy, laser beam, radiation, X-rays, electron beam, radical particles or an ion beam.

The above and other objects, features and advantages of the present invention will become more apparent from the following description when taken in conjunction with the present invention are shown by way of illustrative examples. accompanying drawings in which preferred embodiments of the

PREFERRED EMBODIMENTS OF THE INVENTION

Figure 1A:
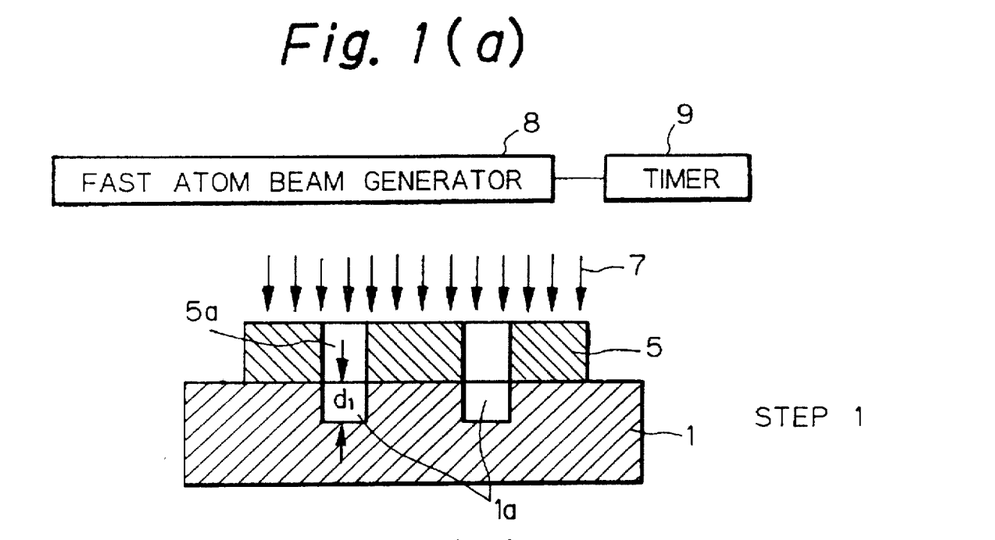
FIGS. 1(a) to 1(c) show one example of the process sequence of the processing method using a fast atom beam according to the present invention.
Figure 1B:
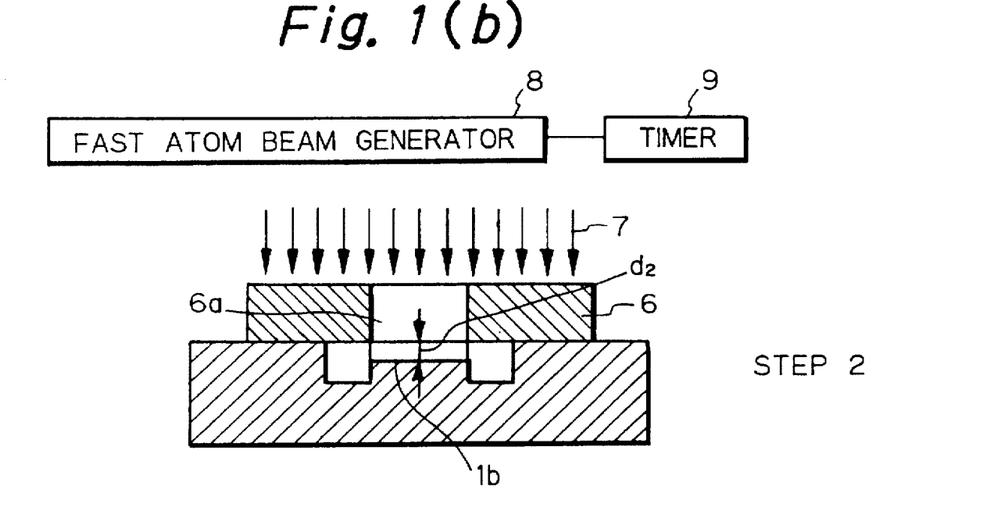
Figure 1C:
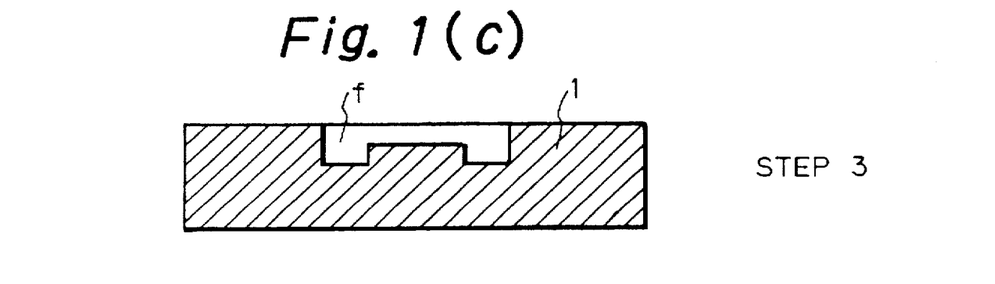

Some preferred embodiments of the present invention will be described below in detail with reference to the accompanying drawings. FIGS. 1(a) to 1(c) illustrate the process sequence of the processing method using a fast atom beam according to the first embodiment of the present invention. In the figure, reference numeral 1 denotes a substrate to be processed. A masking member 5, which is formed with patterned holes 5a having a configuration into which the substrate 1 is to be processed, is placed on the substrate 1. Reference numeral 8 denotes a fast atom beam generator for generating a fast atom beam 7. An irradiation time of the fast atom beam 7 is set by using a timer 9. The masking member 5 is formed from a plate-shaped material of high accuracy, e.g., a thin metallic plate such as a stainless steel plate, which is accurately formed with the patterned holes 5a so that the surface of the substrate 1 can be irradiated with the fast atom beam 7 through the patterned holes 5a.

The masking member 5 may, for example, be formed by cutting the patterned holes 5a in a thin stainless steel plate by a laser beam or casting Ni thin film by a electric forming technique, thereby a masking member having a thickness of few microns could be produced.

The process sequence of the processing method according to the first embodiment of the present invention will be explained below with reference to FIGS. 1(a) to 1(c). The masking member 5 formed with a mask pattern is placed on the substrate 1 to be processed, and the fast atom beam 7 is applied to the masking member 5 from the fast atom beam generator 8. The fast atom beam generator 8 could be a conventional one such as disclosed in U.S. Pat. No. 5,216, 241 issued to Hatakeyama et al. Consequently, the fast atom beam 7 passes through the patterned holes 5a of the masking member 5 and irradiates the surface of the substrate 1. Thus, holes 1a having the same configuration as that of the patterned holes 5a are formed in the surface of the substrate 1 (Step 1). The depth $d_1$ of the holes 1a is determined by the irradiation time of the fast atom beam 7, that is, the time set on the timer 9.

Next, the masking member 5 on the substrate 1 is replaced with another masking member 6 formed with a patterned hole 6a different from the holes 5a, and processing is carried out by repeating the same procedure as the above. As a result, a hole 1b equal in shape to the patterned hole 6a is formed in the surface of the substrate 1 (Step 2). At that time, the depth $d_2$ of the hole 1b can be controlled by varying the irradiation time of the fast atom beam 7 with the timer 9. Thus, it is possible to form the hole 1b having a depth different from that of the holes 1a (Step 3).

Thus, it is possible to eliminate the need for the conventional resist coating and resist pattern forming steps, together with chemical treatment involved therein, by directly applying the fast atom beam 7 to the surface of the substrate 1 through the masking member 5 formed with the patterned holes 5a.

Although in the foregoing embodiment the fast atom beam 7 is applied to the surface of the substrate 1 with the masking members 5 and 6 in close contact with the surface of the substrate, it is also possible to apply the fast atom beam 7 with the masking members 5 and spaced a predetermined distance from the surface of the substrate 1.

Also, it should be noted that in the processing method of the present invention, three-dimensional processing can be performed by moving the location of the masking member or by moving the object to be processed.

Figure 2A:
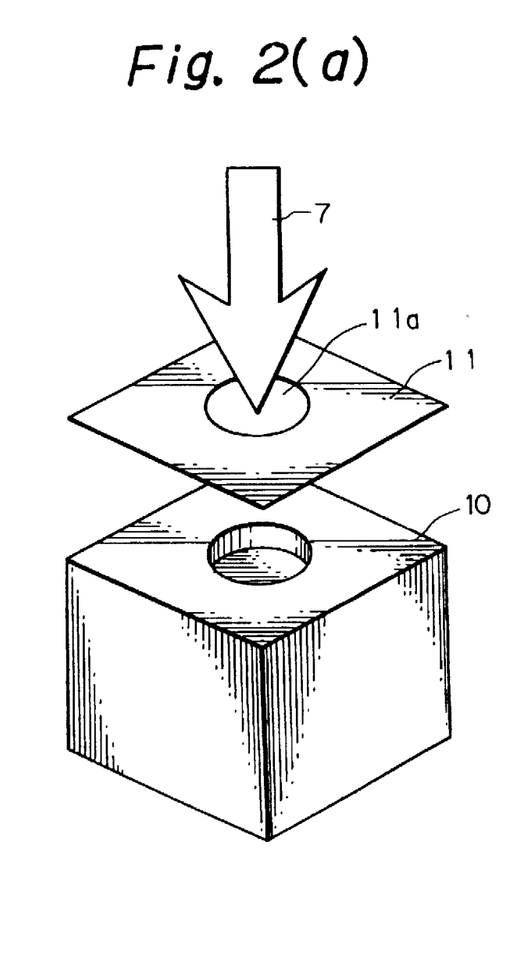
FIGS. 2(a) and 2(b) show a second example of the process sequence of the processing method according to the present invention.
Figure 2B:
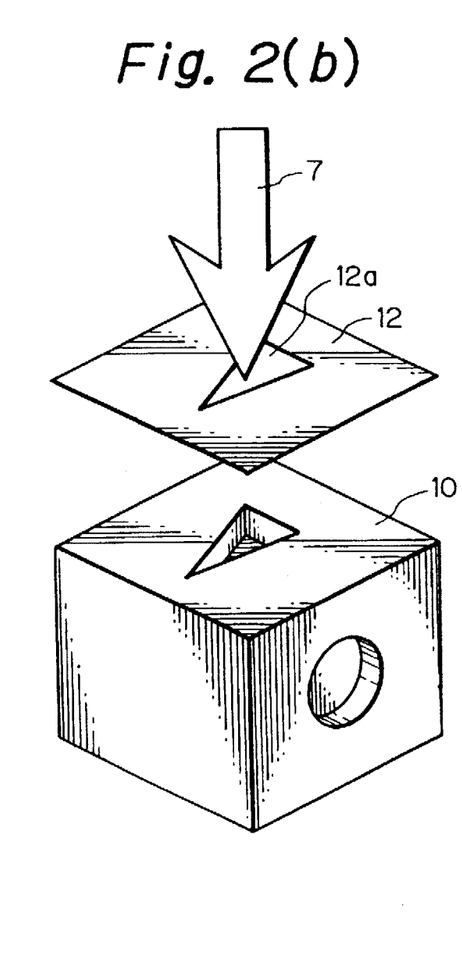

For example, as shown in FIGS. 2(a) and 2(b), first a masking member 11 having a patterned hole 11a is positioned so that it is opposed to a surface of the object 10 (i.e. in close contact with or with a predetermined distance spaced from the surface of the object) to be processed and the fast atom beam 7 is applied to the object and, then the object 10 is rotated so that another masking member 12 having a different patterned hole 12a is opposed to a different surface of the object and the fast atom beam 7 is applied to the object 10 and thereby holes equal in shape to the patterned holes 11a and 11b are formed on the different surfaces of the same object 10.

Figure 3A:
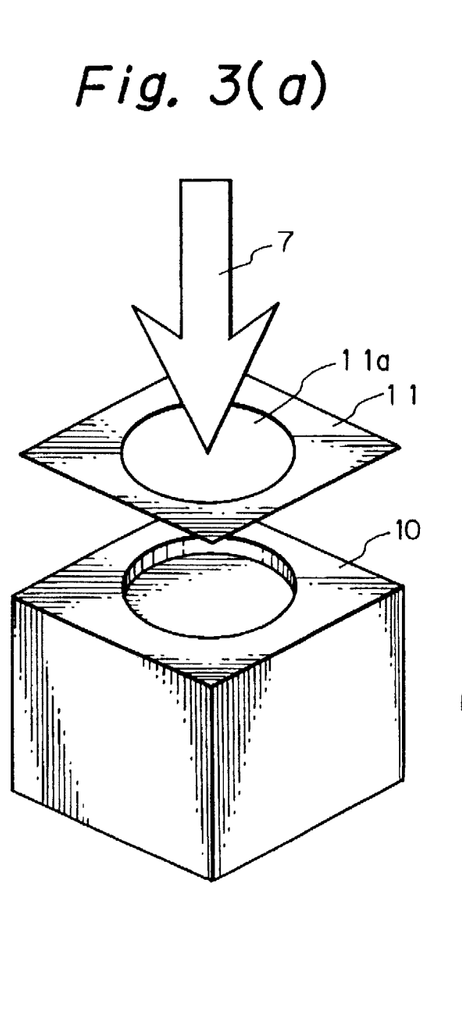
FIGS. 3(a) and 3(b) show a third example of the process sequence of the processing method according to the present invention.
Figure 3B:
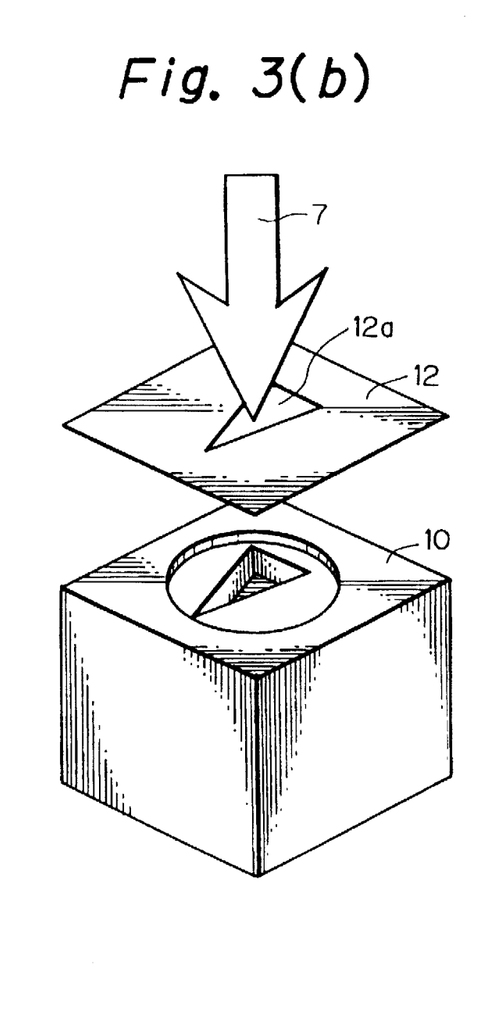

Also, as shown in FIGS. 3(a) and 3(b), first the masking member 11 having a patterned hole 11a is positioned so that it is opposed to a surface of the object 11 and the fast atom beam 7 is applied to the object to form a hole equal in shape to the patterned hole 11a on the surface of the object 10. Then, another masking member 12 having a different patterned hole 12a is opposed to the same surface of the object 10, and the fast atom beam 7 is applied to form a hole equal in shape to the patterned hole 12a in the portion where the hole corresponding to the patterned hole 11a is formed.

Figure 4A:
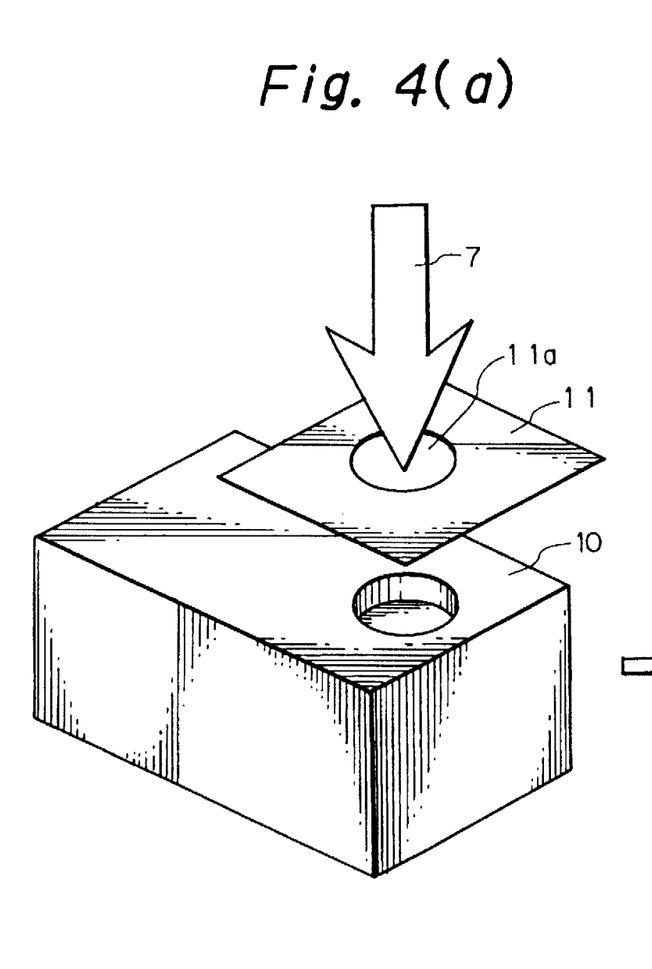
FIGS. 4(a) and 4(b) show a fourth example of the process sequence of the processing method according to the present invention.
Figure 4B:
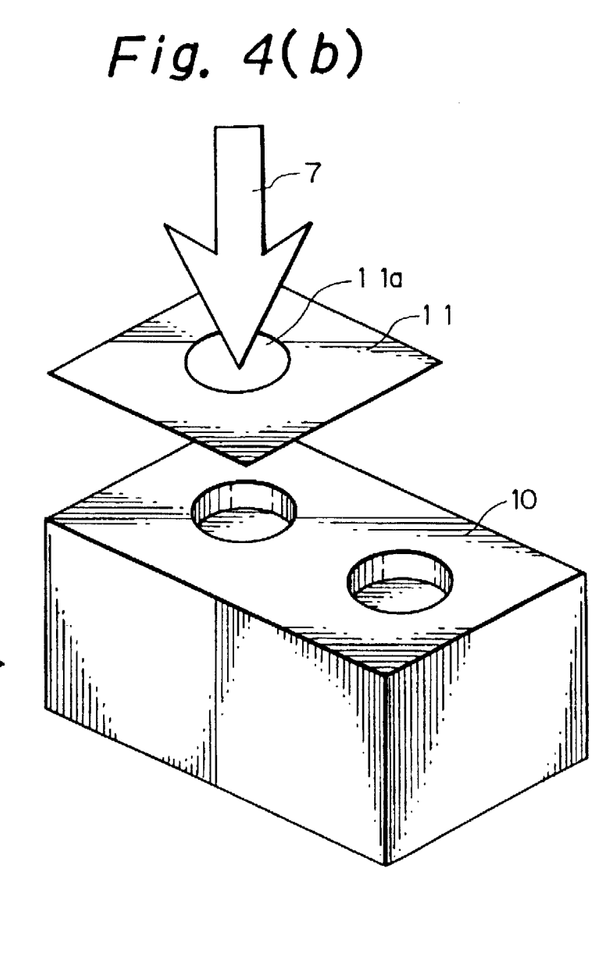

Further, as shown in FIGS. 4(a) and 4(b), first a masking member 11 having a patterned hole 11a is positioned so that it is opposed to a surface of the object 10 and the fast atom beam 7 is applied to the object and, then the masking member 11 or the object 10 is moved so that the masking member 11 is positioned opposed to a different portion of the same surface of the object, and the fast atom beam 7 is applied to the object to thereby form the same holes each corresponding to the patterned hole 11a on the different portions on the same surface of the object 10.

Figure 5A:
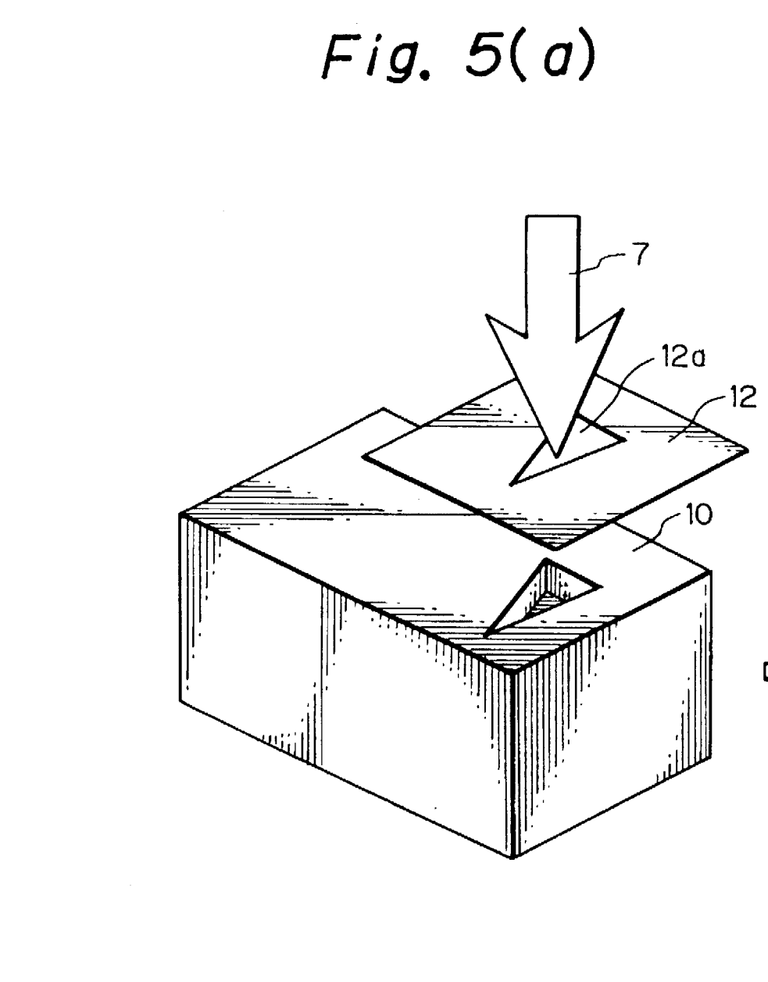
FIGS. 5(a) and 5(b) show a fifth example of the process sequence of the processing method according to the present invention.
Figure 5B:
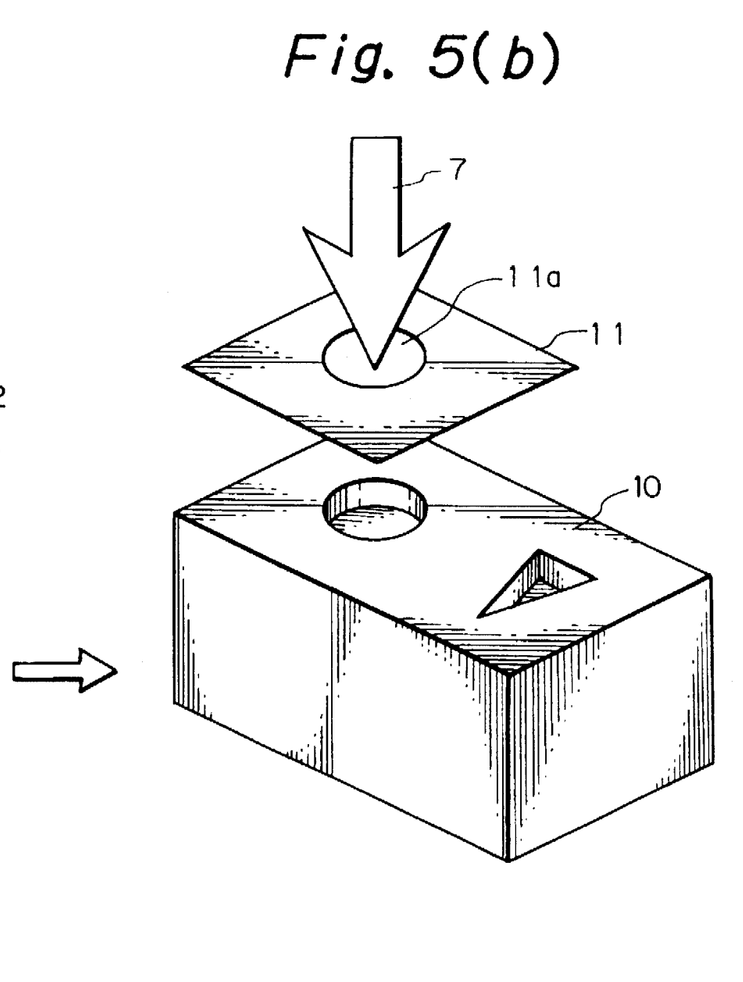

Next, as shown in FIGS. 5(a) and 5(b), first a masking member 12 having a patterned hole 12a is positioned so that it is opposed to a surface of the object 10 and a fast atom beam 7 is applied to the surface and, then the object 10 is moved to a position where another masking member 11 having a different patterned hole 11a is provided or the another masking member 11 is positioned so that it is opposed to a different portion in the same surface of the object and the fast atom beam 7 is applied to the object to thereby form different holes corresponding to respective patterned holes 12a and 11a on the different portions on the same surface of the object 10.

Figure 6A:
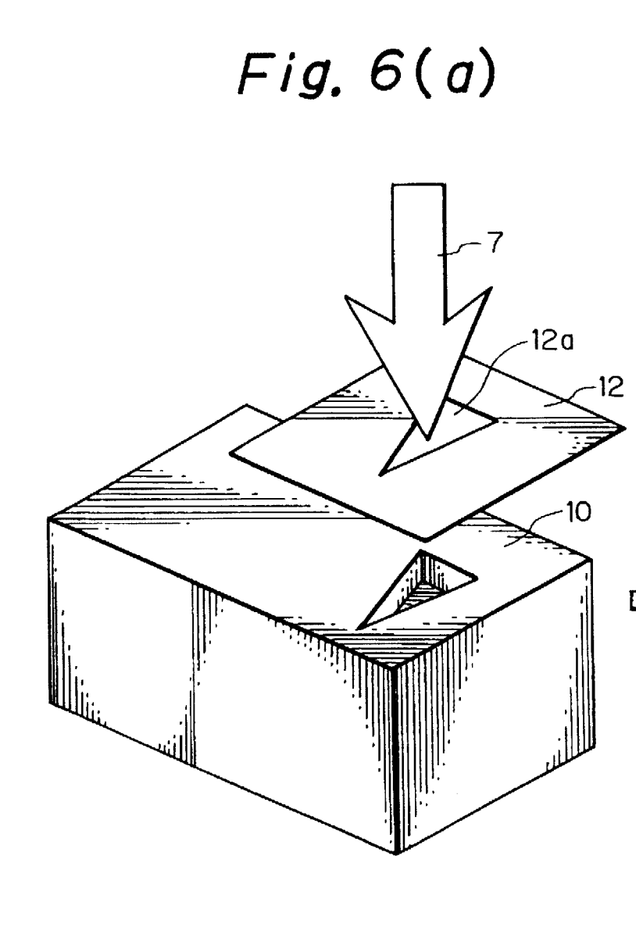
FIGS. 6(a) and 6(b) show a sixth example of the process sequence of the processing method according to the present invention.
Figure 6B:
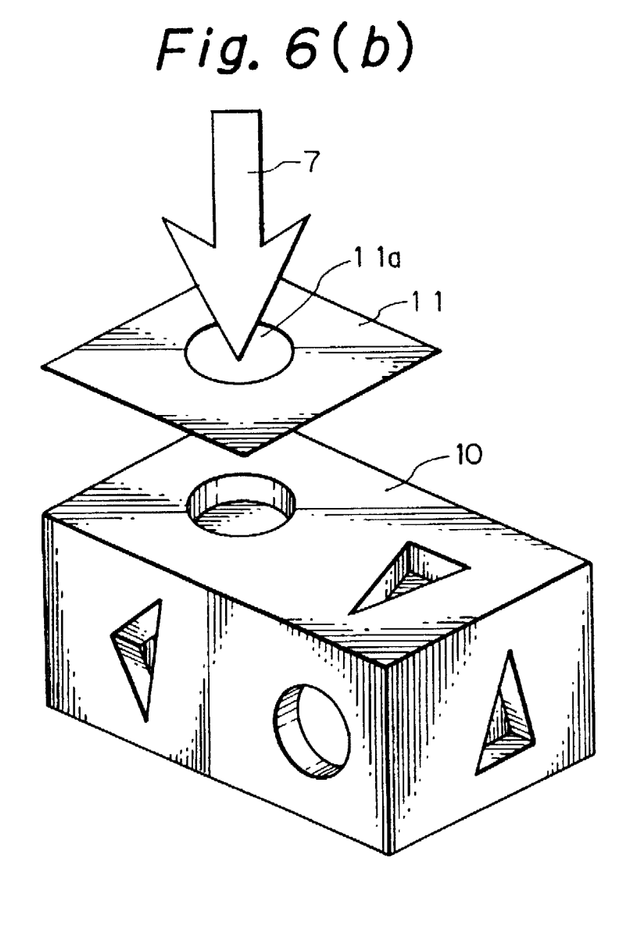

Also, as shown in FIGS. 6(a) and 6(b), masking members 12 and 11 having different patterned holes 12a and 11a are prepared and these masking members 12 and 11 are positioned relative to the object 10 so that they are opposed to the different portions of the different surfaces of the object 10 by moving and rotating the object 10 or by rotating and moving the object 10 and the masking members 12 and 11, respectively and the fast atom beam is applied to the object for each positioning of the masking members, thereby forming different holes corresponding to the patterned holes 12a and 11a on the different portions on the different surfaces of the object 10.

Figure 7A:
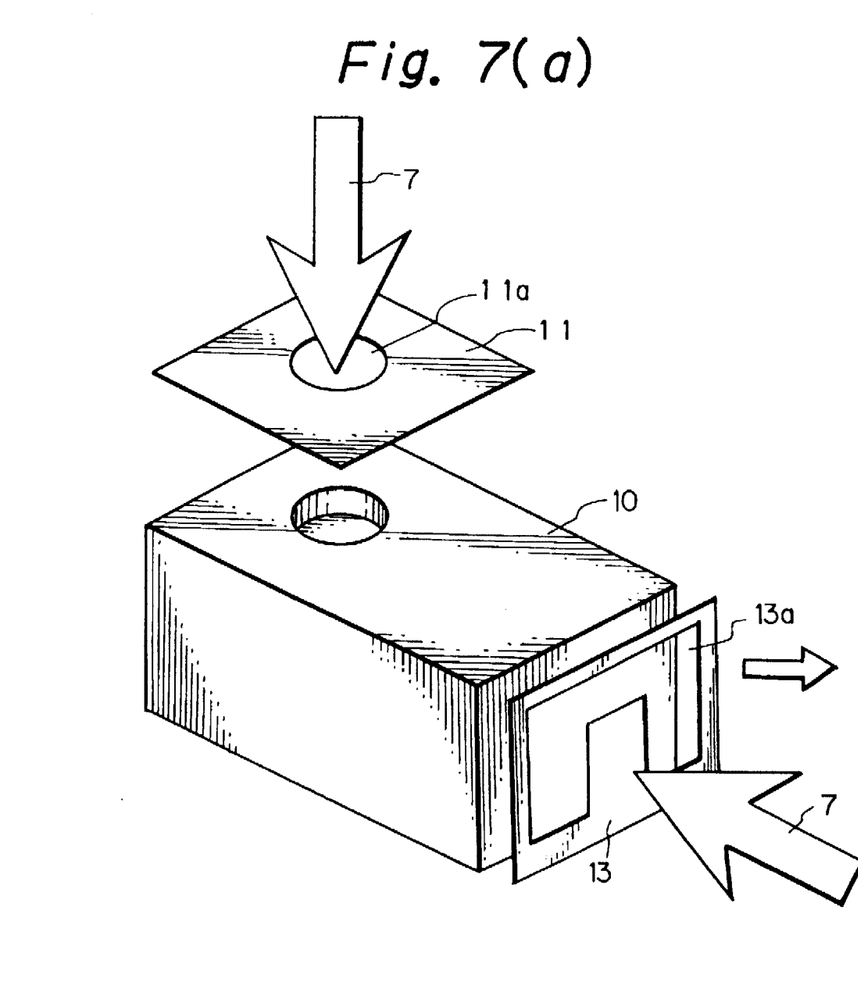
FIGS. 7(a) and 7(b) show a seventh example of the process sequence of the processing method according to the present invention.
Figure 7B:
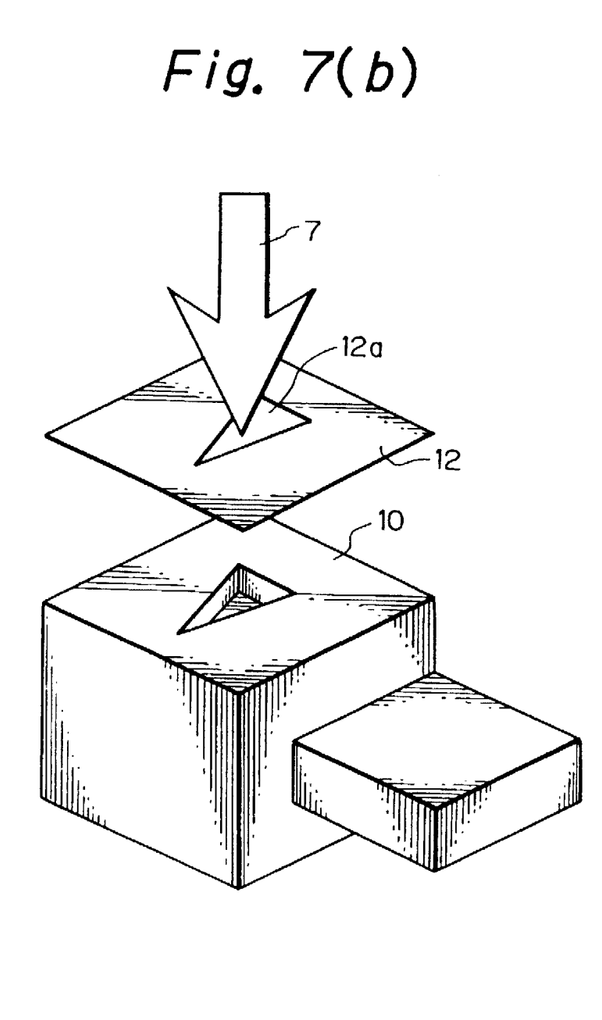

Further, as shown in FIGS. 7(a) and 7(b), first masking members 11 and 13 having different patterned holes 11a and 13a are positioned so that they are opposed to different surfaces of the object 10 and the fast atom beam 7 is applied to the each masking members 11 and 13 and, then the object 10 is rotated and another masking member 12 having a different patterned hole 12a is opposed to the object and the fast atom beam 7 is applied to the object, to thereby form different patterns, on the different surfaces of the object 10.

As described above, according to the processing method of the invention, three-dimensional processing can be performed by positioning the masking members having different patterned holes relative to the object so that they are opposed to a surface or surfaces of the object and by moving the object or the masking members or moving and rotating the object, and applying the fast atom beam for each positioning of the masking members.

Although in the foregoing embodiments the fast atom beam 7 is applied from the fast atom beam generator 8, it should be noted that the processing method of the present invention is not necessarily limited thereto, and that at least one selected from among light energy, laser beam radiation, X-rays, electron beams, radical particles and an ion beam may be used in combination with the fast atom beam. By doing so, the processing speed can be increased because ions and or radicals which have high chemical reactivity and low energy are created on the surface of the substrate 1 by irradiation by light energy, laser beam, radiation, X-rays, electron beams, radical particles or an ion beam.

Figure 8:
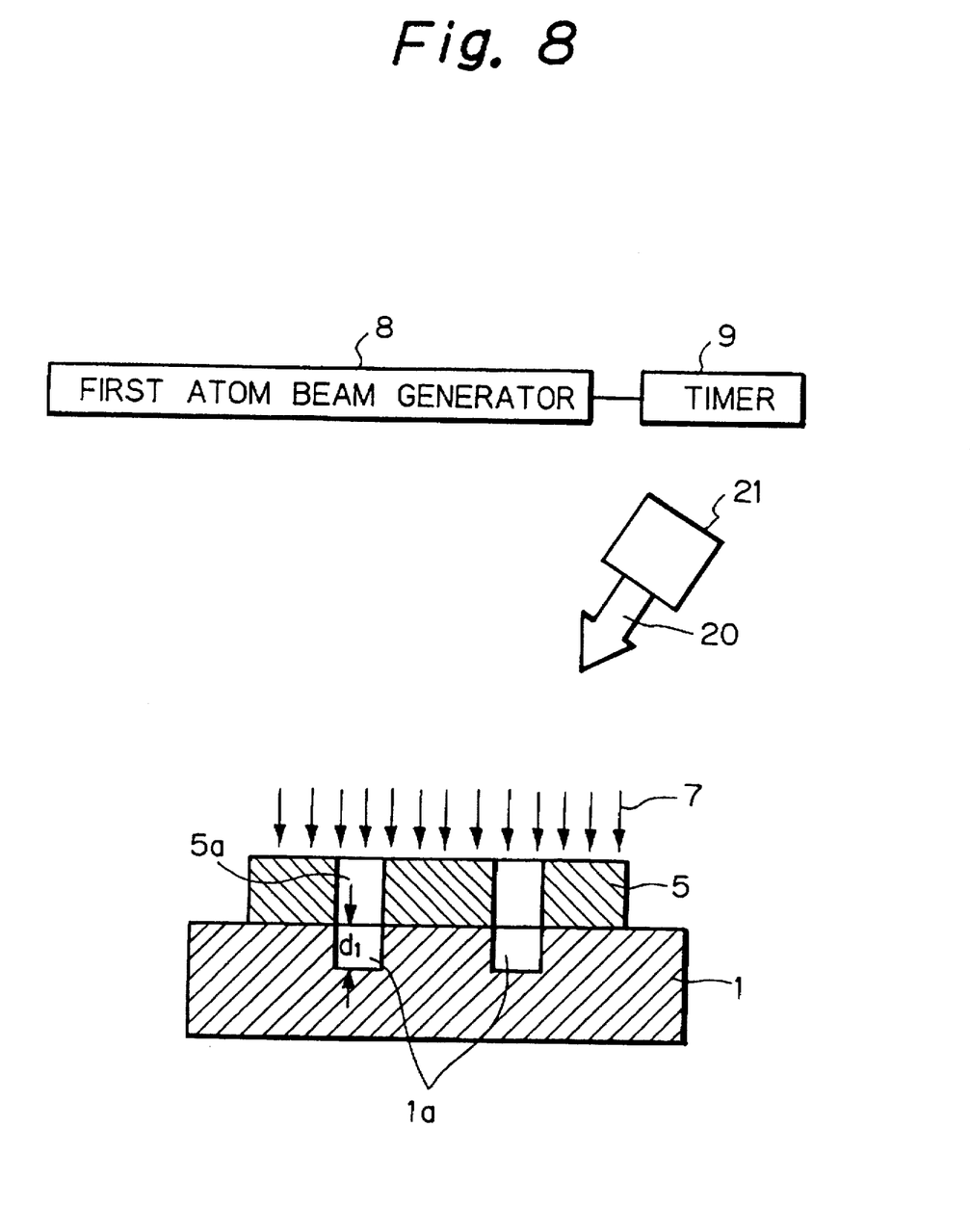
FIG. 8 shows a processing method according to the further embodiment of the present invention.
Figure 9A:
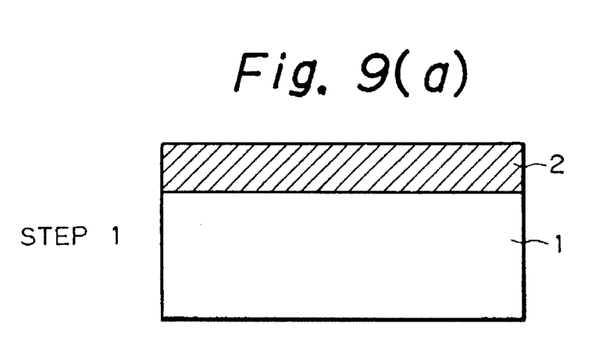
FIGS. 9(a) to 9(e) show one example of the process sequence of the conventional fine pattern processing using a resist.
Figure 9B:
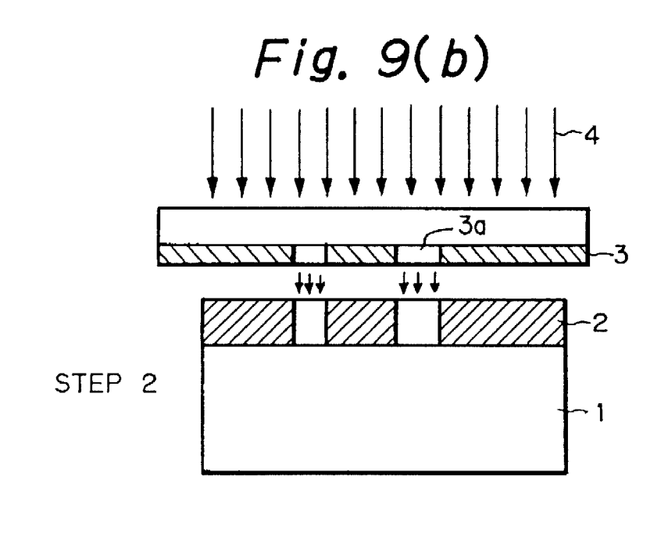
Figure 9C:
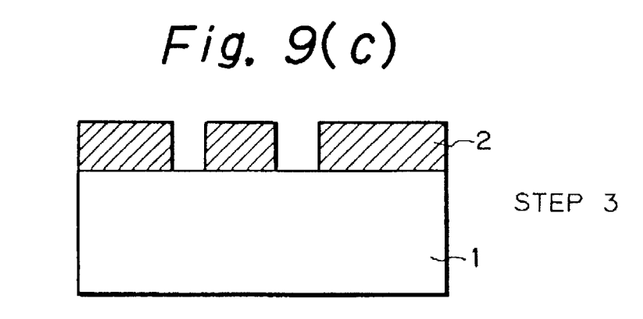
Figure 9D:
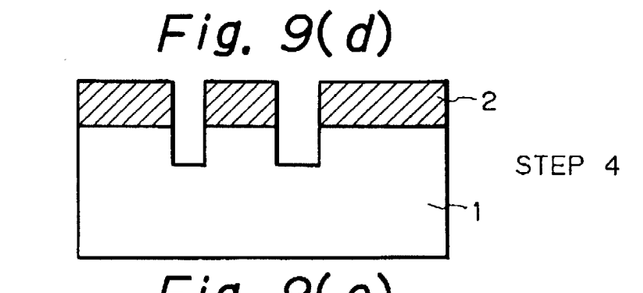
Figure 9E:
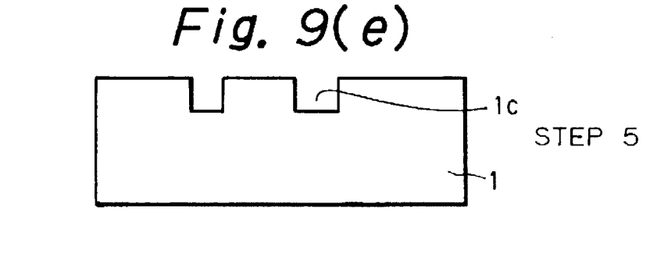

For example, FIG. 8 shows a processing method according to still another embodiment of the present invention.

In this method, a light energy 20 is applied to the masking member from light source 21, such as a heavy hydrogen lamp, in addition to the fast atom beam 7 from the fast atom beam source 8, wherein a chemical reactive gas such as cloride, fluoride or oxygen is used as a discharge gas.

In such a case, in addition to the processing by the fast atom beam 7 from the fast atom beam generator 8, the following operation is effected. Namely, the reactive gas particles coming from the fast atom beam generator 8 and adsorbed on the surface of the object 1 to be processed are activated by the application of the light energy 20 and create radicals which increase the processing speed. Also, by application of the right energy, atoms in the surface layer of the object 1 are activated which assists the processing by the fast atom beam and radicals. Further, chemical processing by the radicals assists the physical processing by the fast atom beam having excellent directivity which enables precise processing in the depthwise direction of the patterned hole.

A similar operation could be effected by the application of electron beams, a laser beam, X-rays, radiation, radical particles, an ion beam or combination of these irradiation energy together with the fast atom beam to increase the processing speed.

In particular, when relatively high energy irradiation such as an X-ray or a radiation is combined with the irradiation of the fast atom beam, then atoms in the surface layer in the object to be processed are activated and the atomic bonding is weakened or loosened which assists processing by the fast atom beam and the radicals or ions.

Further, when an electron beam or laser beam is used, it enables a local processing of the object which makes figure control of the product easy.

As has been detailed above, it is possible according to the present invention to expect advantageous effects as stated below:

The conventional fine pattern processing requires considerably complicated and troublesome processes, e.g., resist coating, resist pattern formation by exposure and development, baking, etc., in the resist coating and resist pattern forming steps and must use an apparatus for carrying out each step. However, the processing method of the present invention, which uses a fast atom beam and a masking member formed with a patterned hole, does not require such resist coating and resist pattern forming steps. Moreover, it is possible to form a patterned configuration on a substrate to be processed in the same vacuum container. Accordingly, the processing time and process are shortened. Further, it is possible to realize clean and efficient processing by carrying out all the processing steps in a vacuum.

In addition, since non-charged particle rays are used, it is possible to process not only an electrically conductive material but also an insulating material, which cannot effectively be processed by an ion beam.

Further, in the present invention, the depth of a processed portion can be controlled by controlling the irradiation time of the fast atom beam with a timer. Therefore, it is possible to readily process a substrate with a structure having a different shape in the depthwise direction.

Incidentally, the present invention may be widely used not only in fine pattern processing such as in the manufacture of semiconductor devices, but also in general pattern forming in conductor, semiconductor and insulating materials which uses a masking member and a fast atom beam.

What is claimed is:

1. A processing method comprising the step of:
    covering a surface of an object to be processed with a non-fixed movable masking member formed with a hole with a pattern therein in contact with or with a predetermined gap closely spaced from said surface of said object, and
    irradiating said masking member with a fast atom beam of neutrally charged atoms or molecules that have a kinetic energy above several eV so that said object is processed by said fast atom beam applied to the surface of said object through the hole in said masking member to create said pattern on said object.

2. The processing method of claim 1, wherein said masking member is moved relative to said object for irradiating selected portions of said object with said fast atom beam.

3. The processing method of claim 1, wherein said object is moved relative to said masking member for irradiating selected portions of said object with said fast atom beam.

4. The processing method of claim 1, wherein a surface of the same object to be processed is sequentially covered with masking members having different patterned holes, and the surface of said object is irradiated with said fast atom beam for each masking member, thereby processing said object.

5. The processing method according to any one of claims 1 to 4, wherein light energy or laser beam is used in addition to said fast atom beam.

6. The processing method according to any one of claims 1 to 4, wherein X-rays or radiation (alpha rays, beta rays, or gamma rays) are used in addition to said fast atom beam.

7. The processing method according to any one of claims 1 to 4, wherein electron beam are used in addition to said fast atom beam.

8. The processing method according to any one of claims 1 to 4, wherein an ion beam or radical particles is used in addition to said fast atom beam.

9. The processing method according to any one of claims 1 to 4, wherein a combination of at least two selected from among light energy, laser beam, radiation, X-rays, electron beams, radical particles and an ion beam is used in addition to said fast atom beam.

10. The processing method according to any one of claims 1 to 4, wherein said processing is performed on a plurality of surfaces of said object.

11. The method of claim 1, further comprising:

covering a surface of a second object to be processed with said non-fixed movable mask member; and irradiating said masking member with a fast atom beam of neutrally charged atoms or molecules that have a kinetic energy above several eV so that said second object is processed by said fast atom beam applied to the surface of said second object through the patterned hole in said masking member to create said pattern or said second object.

12. The method of claim 1, further comprising:

first, forming the non-fixed movable masking member with the hole with the pattern; and second, after the non-fixed movable masking member is formed, covering said object to be processed with the non-fixed movable masking member.

* * * * *